United States Patent
Speck et al.

(10) Patent No.: US 7,795,146 B2
(45) Date of Patent: Sep. 14, 2010

(54) ETCHING TECHNIQUE FOR THE FABRICATION OF THIN (AL, IN, GA)N LAYERS

(75) Inventors: James S. Speck, Goleta, CA (US); Benjamin A. Haskell, Santa Barbara, CA (US); P. Morgan Pattison, Morgantown, WV (US); Troy J. Baker, Santa Barbara, CA (US)

(73) Assignees: The Regents of the University of California, Oakland, CA (US); Japan Science and Technology Agency, Kawaguchi, Saitama, Prefecture ( * ) Notice: Subject to any disclaimer, the term of this patent is extended or adjusted under 35 U.S.C. 154(b) by 398 days.

(21) Appl. No.: 11/403,288

(22) Filed: Apr. 13, 2006

(65) Prior Publication Data
US 2006/0246722 A1 Nov. 2, 2006

Related U.S. Application Data

(60) Provisional application No. 60/670,790, filed on Apr. 13, 2005.

(51) Int. Cl.
*H01L 21/461* (2006.01)
(52) U.S. Cl. .............. 438/689; 438/458; 438/705; 438/745
(58) Field of Classification Search .......... 438/458, 438/689, 705, 745
See application file for complete search history.

(56) References Cited

U.S. PATENT DOCUMENTS

| | | | |
|---|---|---|---|
| 5,754,714 A * | 5/1998 | Suzuki et al. | 385/5 |
| 6,120,597 A | 9/2000 | Levy et al. | |
| 2002/0096496 A1 | 7/2002 | Molnar et al. | |
| 2002/0166502 A1 | 11/2002 | Vaudo et al. | |
| 2002/0182889 A1 | 12/2002 | Solomon et al. | |
| 2003/0008477 A1* | 1/2003 | Kang et al. | 438/458 |
| 2004/0144301 A1 | 7/2004 | Neudeck et al. | |

OTHER PUBLICATIONS

Plummer, Silicon VLSI Technology Fundamentals, Practice and Modeling, 2000, Prentice Hall, p. 61.*
Minsky, M.S. et al., "Room-temperature photoenhanced wet etching of GaN," Appl. Phys. Lett., 1996, 68 (11):1531-1533.

* cited by examiner

*Primary Examiner*—Kiesha R Bryant
*Assistant Examiner*—Tucker Wright
(74) *Attorney, Agent, or Firm*—Gates & Cooper LLP

(57) ABSTRACT

An etching technique for the fabrication of thin (Al, In, Ga)N layers. A suitable template or substrate is selected and implanted with foreign ions over a desired area to create ion implanted material. A regrowth of a device structure is then performed on the implanted template or substrate. The top growth surface of the template is bonded to a carrier wafer to created a bonded template/carrier wafer structure. The substrate is removed, as is any residual material, to expose the ion implanted material. The ion implanted material on the bonded template/carrier wafer structure is then exposed to a suitable etchant for a sufficient time to remove the ion implanted material.

14 Claims, 2 Drawing Sheets

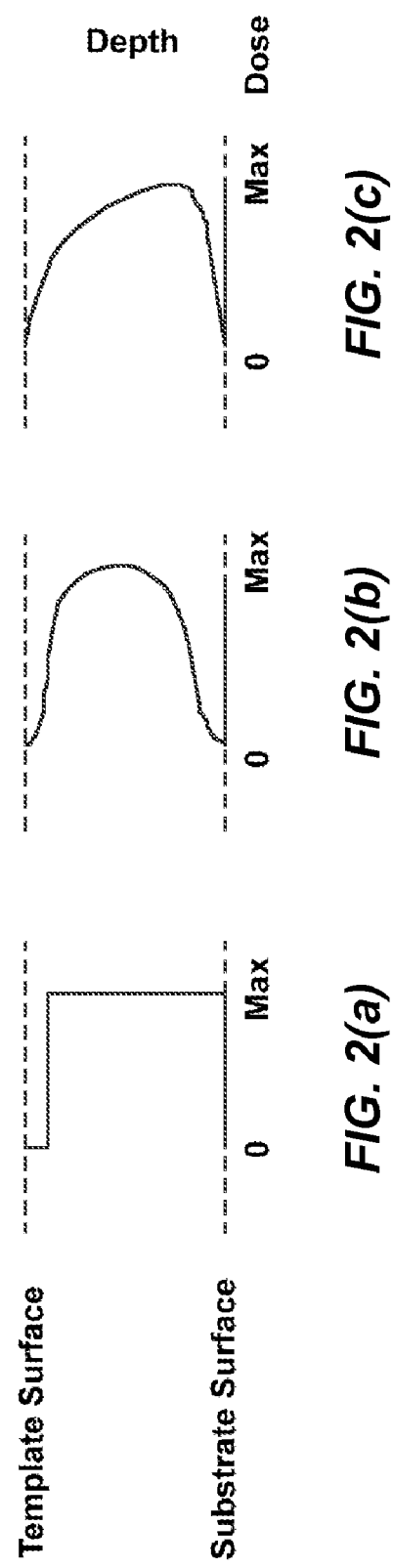

ETCHING TECHNIQUE FOR THE FABRICATION OF THIN (AL, IN, GA)N LAYERS

CROSS-REFERENCE TO RELATED APPLICATIONS

This application claims benefit under 35 U.S.C Section 119(e) of the following commonly-assigned provisional application:

U.S. Provisional Patent Application Ser. No. 60/670,790, filed on Apr. 13, 2005, by James S. Speck, Benjamin A. Haskell, P. Morgan Pattison and Troy J. Baker, entitled "ETCHING TECHNIQUE FOR THE FABRICATION OF THIN (Al, In, Ga)N LAYERS,";

which application is incorporated by reference herein.

This application is related to the following co-pending and commonly-assigned U.S. patent applications:

U.S. Utility patent application Ser. No. 11/403,624, filed on Apr. 13, 2006, by James S. Speck, Troy J. Baker, and Benjamin A. Haskell, entitled "WAFER SEPARATION TECHNIQUE FOR THE FABRICATION OF FREE-STANDING (Al, In, Ga)N WAFERS,", which application claims the benefit under 35 U.S.C. Section 119(e) of U.S. Provisional Patent Application Ser. No. 60/670,810, filed on Apr. 13, 2005, by James S. Speck, Troy J. Baker, and Benjamin A. Haskell, entitled "WAFER SEPARATION TECHNIQUE FOR THE FABRICATION OF FREE-STANDING (Al, In, Ga)N WAFERS,";

which applications are incorporated by reference herein.

BACKGROUND OF THE INVENTION

1. Field of the Invention

The present invention relates to an etching technique for the fabrication of thin (Al, In, Ga)N layers.

2. Description of the Related Art

Gallium nitride (GaN), and its related ternary and quaternary alloys incorporating aluminum (Al) and indium (In), have attracted widespread interest in the fabrication of high power electronics and visible and ultraviolet optoelectronic devices. Unfortunately, two broad challenges exist in the fabrication of useful devices based on group III nitrides.

First, none of the (Al, In, Ga)N group materials can be readily grown in bulk form. As a result, nitride materials are generally grown by complex techniques, including metalorganic chemical vapor deposition (MOCVD), hydride vapor phase epitaxy (HVPE), and molecular beam epitaxy (MBE). Because of the difficulty in fabricating bulk nitride crystals, the vast majority of group III nitride films and devices are grown heteroepitaxially, i.e., on foreign substrates such as sapphire ($Al_2O_3$) and silicon carbide (SiC).

Heteroepitaxial growth generally introduces defects into the nitride films, ranging from threading dislocations to cracks and voids, all of which are deleterious to device performance. Numerous techniques have been developed to reduce the densities of various defects that form during heteroepitaxial growth of nitrides. However, most of these techniques involve growth of films that are thick compared to the actual device structures. These processes can introduce additional impurities, point defects, inhomogeneities, and strain in the composite substrate/nitride film structure that can complicate subsequent device fabrication.

A second significant challenge facing group III nitride device fabrication stems from the chemical, mechanical, and refractory robustness of group III nitrides once they are successfully grown. It is frequently necessary to selectively remove nitride material in order to form mesas, cavities, and membranes, or to completely remove foreign substrates from the nitride films. Unlike silicon and conventional III:V semiconductors such as indium phosphide (InP) and gallium arsenide (GaAs), of which chemical etching is readily performed, etching of group III nitrides has proven extremely difficult.

Several dry etching techniques involving ion bombardment of the nitride surface, including reactive ion etching and inductively coupled plasma etching, have been developed for top-down etching of nitride films and structures. These processes are complex and expensive and great care must be taken to ensure that remaining material is not damaged. Furthermore, these techniques are only suitable for vertical etching, and no equivalent dry lateral etching technique exists. As an added complexity, the ability to etch group III nitrides diminishes as the material quality is improved, e.g. through the dislocation reduction techniques mentioned above.

One lateral etch technique has been developed for group III nitrides. In this process, termed photoelectrochemical (PEC) etching, a combination of above bandgap irradiation and formation of an electrochemical cell using dilute hydrogen chloride (HCl) or potassium hydroxide (KOH) electrolytes is used to selectively etch nitride film on the basis of the films' electronic properties. The incident radiation breaks chemical bonds forming photoexcited holes that allow for oxidation and removal of the irradiated material in the electrolyte solution. This process has proven thus far to be the most effective technique for achieving lateral etching of (Al, In, Ga)N structures.

However, PEC etching suffers from several drawbacks. First, it is bandgap selective, meaning that any material having a smaller band gap than the energy of the incident radiation can potentially etch. For example, a PEC etching process designed to remove an InGaN post from a visible optoelectronic device could potentially etch the InGaN quantum wells in the structure as well as the post. Second, the PEC etching process can be cumbersome to perform, requiring masking, electrode formation, fabrication of suitable optical filters, and use of potentially damaging ultraviolet irradiation. Third, the achievable etch rates are comparatively slow, reaching a maximum of a few micrometers per minute.

There exist numerous applications in which it is desirable to remove a thin (Al, In, Ga)N structure from its substrate. For example, growth of AlGaN-containing optoelectronic device structures on SiC substrates is often performed. Unfortunately, the bandgap of SiC is in the near ultraviolet range of the electromagnetic spectrum, and therefore the substrate will absorb light emitted from most ultraviolet emitters, decreasing device external efficiency.

A similar problem occurs when deep ultraviolet light emitters are grown on free standing GaN substrates. Removal of the absorbing substrate and mounting of the device membrane on a transparent carrier wafer could allow for increased device efficiency.

In a second example, improved light emitting diode external efficiency could be realized if microcavity device geometries could be fabricated. The formation of microcavities requires the formation of very thin (~40 nm-800 nm) III:N membranes on foreign substrates, which is very challenging using presently available substrate removal and lateral etching techniques.

As mentioned above, in order to grow a high quality optical or electronic device in the (Al, In, Ga)N material system the electrically or optically active layers must be grown on top of thick GaN layers (~4 μm). For microcavity LED fabrication, the thick heteroepitaxially grown GaN template or buffer first must be removed from the growth substrate (usually sapphire) and then thinned using ion bombardment dry etch techniques. Thickness control of the etch needs to be +/−25 nm so as to obtain a high quality microcavity resonator. But, as mentioned previously, there is very little selectivity with dry etching of GaN and precise thickness control is very difficult to achieve.

Another drawback of dry etching is the potential to damage the optically active layers and reduce the device efficiency. Attempts to perform such substrate removals with laser-assisted liftoff have had very limited success and extremely low yield as the device structures are frequently damaged in the liftoff and etch processes. When the devices are not damaged by the liftoff or etching, the thickness has been difficult to control much of the time, generating low efficiency devices unsuitable for today's technological demands. Therefore, a clear need exists for a physically selective vertical and lateral etch technique that may be used for the reproducible formation of thin (Al, In, Ga)N membranes without damaging the nitride structures therein.

A growing body of literature exists on etching of chemically and mechanically robust materials using ion implantation. Ion slicing is a type of epitaxial liftoff process that involves selective etching of a buried sacrificial layer that is formed by ion implantation. A hard material is subjected to a moderate dose of ions, generating a subsurface damage layer. This damage layer becomes more susceptible to chemical attack than the higher quality bulk material.

The first variation of this ion-assisted etching process was applied to diamond at Oak Ridge National Lab in 1995. First, a single crystal diamond was implanted with carbon or oxygen, after which the diamond was heated to graphitize the damage layer. The graphite layer was then removed by etching in hot chromic acid, leaving the surrounding diamond unaffected. A subsequent refinement of this technique involved heating the diamond/graphite sample in the presence of oxygen at a temperature high enough preferentially oxidize that graphite without affecting the diamond.

Ion slicing has attracted particular attention in metal oxide electro-optical ceramics research. There exists a strong demand for nonlinear optical waveguides coupled with conventional microelectronic devices. Unfortunately, it is difficult to grow single crystal waveguide films on semiconductors, but these waveguide materials, including yttrium iron garnet, lithium niobate, and potassium tantalite, are available in single crystal bulk form. These bulk optical materials were implanted with helium (He) ions, then wet etched to detach single crystal films that were bonded to semiconductor substrates either before or after the etching of the sacrificial layer.

Ion implantation of III:nitrides has been studied for a number of years, predominantly for the purpose of influencing the electronic properties of nitride-based device structures. However, two groups have reported on the use of ion implantation to selectively etch gallium nitride.

A group from the Naval Research Lab recently disclosed a process for selectively etching GaN vertically utilizing ion implantation to achieve etch selectivity. They demonstrated a post-growth ion implantation process that can be used to encourage selective etching of GaN by potassium hydroxide-based photoresist developer. They found that, when a selectively implanted GaN sample is exposed to photoresist developer, only the exposed ion implanted regions etch in the solution. Their United States Utility Patent Application Publication No. US 2002/0096496, filed Nov. 29, 2000, published Jul. 25, 2002, by Molnar et al., and entitled "Patterning of GaN crystal films with ion beams and subsequent wet etching," discusses several applications of their invention, but their claims specifically require that the GaN be ion implanted in an "imagewise" fashion, rather than over entire surfaces. The claims in this patent application also imply that said implantation would be performed after all growth steps had been performed, which would result in damage to device layers that were not masked from implantation. It is also implicit in this patent application that said etching occurs from the upper growth surface, thus making the technique unsuitable for the fabrication of microcavity devices. Therefore, there exists a clear need for a reproducible backside etching technique that minimizes damage to device layers for the fabrication of microcavity devices.

The present invention provides a selective etching technique that can be used for removal of excess (Al, In, Ga)N from the backside of a template without harming sensitive device layers. As noted above, other known ion bombardment etching techniques, such as reactive ion etching and inductively coupled plasma etching, generate knock-on damage in sensitive device layers, and photoelectrochemical etching tends to attack active quantum well layers, as well as the excess template material. All three of these techniques tend to etch different (Al, In, Ga)N facets at different rates, resulting in large scale roughening of the etched surface. Chemical etching of non-implanted (Al, In, Ga)N proceeds far too slowly to be of practical use due to the chemical inertness of nitride compound semiconductors. Achieving planar removal of material on the nanometer scale with mechanical polishing is virtually impossible. The present invention is free of all of these deficiencies and has widespread application. Perhaps the most promising application of the present invention is in the fabrication of optoelectronic devices such as microcavity light emitting structures, as the invention does not expose the device cavity itself to ion bombardment, mechanical stresses, or irradiation, while still providing for the well-defined removal of underlying material.

SUMMARY OF THE INVENTION

The present invention provides a method of selective etching technique for use with (Al, In, Ga)N materials. In particular, this etching technique is designed to separate thin nitride membranes from their substrates. Alternatively, the present invention may be used to fabricate free-standing nitride wafers by the same technique. An additional object of this invention is to facilitate the formation of nitride microcavity structures for optoelectronic device applications.

BRIEF DESCRIPTION OF THE DRAWINGS

Referring now to the drawings in which like reference numbers represent corresponding parts throughout:

FIGS. 2(a), (b) and (c) illustrate sample ion implantation profiles according to the preferred embodiment of the present invention.

DETAILED DESCRIPTION OF THE INVENTION

Figure 1:
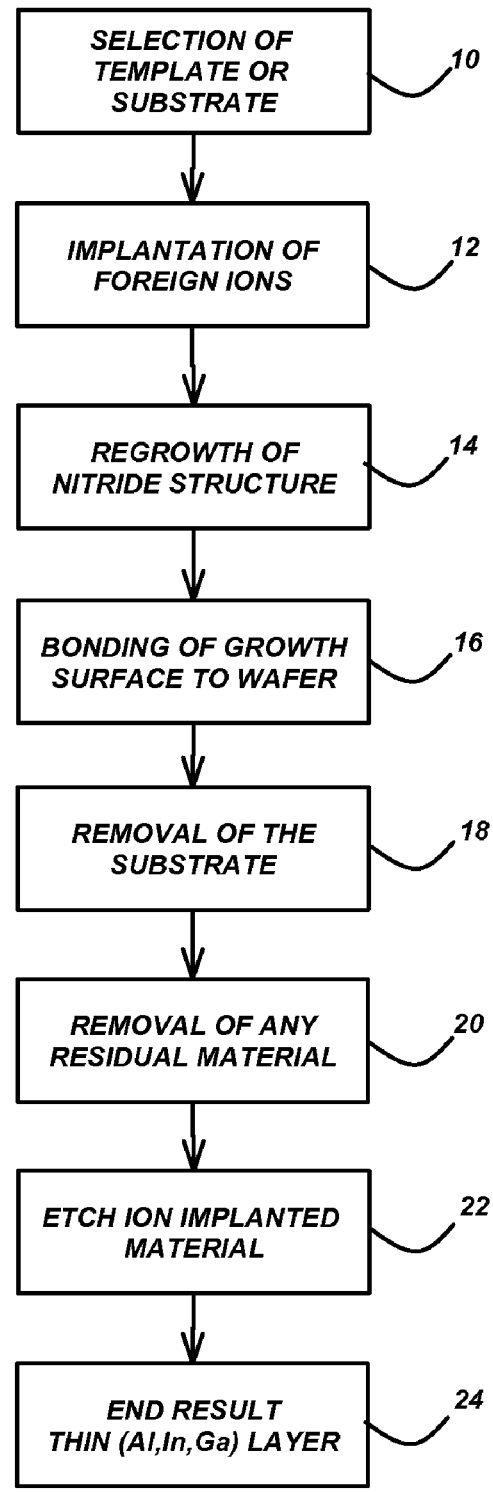
FIG. 1 is a flowchart that illustrates the process steps of the preferred embodiment of the present invention.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention is directed to selective etching of nitrides, and more particularly, to the fabrication of thin membranes. The present invention describes a novel method to allow ex situ separation of epitaxially-grown nitride films from their substrates or templates. In the practice of the invention, (Al, In, Ga)N templates are implanted with ions to form a damage layer, leaving the template surface unaffected by the process. A thin (Al, In, Ga)N layer or device structure is then grown on the implanted template. Following growth, the wafer is removed from the growth system and fused through conventional wafer bonding techniques to a submount or carrier wafer.

Next, there are two possible manifestations of this invention. The first option is to subject the system to a selective chemical etching process in which case the etching proceeds in a lateral fashion to separate the regrowth from the substrate. The other option is to remove the substrate first, for example, by laser liftoff and then proceed to selectively etch the implanted template to the etch stop at the regrowth surface. By these processes, the substrate may be removed either over selected areas or completely to form nitride membrane structures or even thick nitride wafers. The present invention is particularly useful for the fabrication of microcavity light emitting device structures.

Technical Description

The present invention provides for the non-crystallographic removal of (Al, In, Ga)N material from thin membranes or layers without damaging sensitive device structures. In particular, the invention is useful for the fabrication of a microcavity light emitting device.

FIG. 1 is a flowchart that illustrates a method of etching thin epitaxially-grown nitride layers according to the preferred embodiment of the present invention.

Block 10 represents selecting a suitable template or substrate, such as a 2 μm thick GaN film on a sapphire substrate. Alternatively, a substrate itself, without any additional layers, may be used, as well as a substrate with one or more different layers.

Block 12 represents implanting the template or substrate with foreign ions over a desired area to create ion implanted material, wherein the desired area ranges from an entire wafer to at least one selected region delineated by an implantation mask. The implanting step may comprise selecting an implantation profile or damage layer for the implanting step, and the implantation layer or damage layer may determine an etch rate and a risk of crystallographic etching for the ion implanted material. The implanting step may also comprise selecting a dose and an implanted species of ion such that implanted ions do not diffuse enough to coalesce into bulk voids when heated to a growth temperature. The ion implanted material forms a damage layer, leaving the template's surface unaffected, and the damage layer etches more readily and without regard to crystal orientation as compared to non-implanted material. The template's surface remains intact following the implanting step, so as to provide a high quality crystalline surface for a regrowth.

Block 14 represents performing a regrowth of a nitride structure, particularly a microcavity structure, on the implanted template or substrate, by a suitable growth technique, such as MOCVD or MBE. In this context, a "nitride structure" is any layer or series of layers of $(Al_x, In_y, Ga_z)N$, where $0<=x<=1$, $0<=y<=1$, $0<=z<=1$, and $x+y+z=1$, having a thickness ranging from 1 nm to 100 mm. For example, the nitride structure may be a single thick GaN layer with a 300 μm thickness, or a light emitting diode heterostructure having a total thickness of 500 nm.

Block 16 represents bonding an exposed growth surface of the nitride structure to a carrier wafer, through conventional wafer bonding or comparable techniques, to create a bonded nitride structure/carrier wafer structure.

Block 18 represents removing the substrate or template from the nitride structure/carrier wafer structure by a conventional substrate removal technique, such as laser-assisted debonding. The substrate may be removed either over at least one selected area or completely to form nitride membrane structures or thick nitride wafers.

Block 20 represents removing any residual material between the former substrate/template interface and the ion implanted material, if necessary, to expose the ion implanted material.

Block 22 represents exposing the ion implanted material on the bonded nitride structure/carrier wafer structure to a suitable etchant, such as dilute potassium hydroxide or hydrochloric acid, for a sufficient time to remove the ion implanted material. The exposing step may comprise performing a chemical etching process in which etching proceeds in a lateral fashion to separate the regrowth from the substrate. The exposing step may also comprise selectively etching the ion implanted material to an etch stop below the template or substrate surface and defined by an implantation profile or damage layer.

This process enables the nitride structure/carrier wafer structure to be etched from the backside (i.e., the surface opposite the surface comprising the nitride regrowth), thereby minimizing damage to the regrown layers.

Another option is to skip Blocks 18 and 20, and go straight to Block 22. In this case, the etch of Block 22 would be lateral and undercutting. The substrate would be removed from the device by the etch.

Block 24 represents the end result of the process, which comprises a thin (Al, In, Ga)N layer fabricated using this method. In addition, Block 24 represents a free-standing substrate, optoelectronic device, a transistor, or a non linear optical waveguide including the thin (Al, In, Ga)N layer fabricated using this method.

The choice of substrate depends on several factors, including the desired orientation of the (Al, In, Ga)N film, the intended wafer separation technique, and the growth technique. For a first example, r-plane sapphire would be a natural substrate choice if the nitride film to be grown was to be a-plane oriented and the wafer separation technique selected was laser-assisted debonding. As a second example, (100) γ-lithium aluminate (LiAlO) would be preferable if m-plane GaN was the desired film orientation and wet chemical etching was the preferred substrate removal technique. As a third example, (0001) Si-face 6H—SiC could be selected as a substrate for c-plane GaN growth and dry reactive ion etching could be used for substrate removal. While these examples have suggested possible substrate/template combinations, one skilled in the art will recognize that many other combinations of substrates and template layers and structures could be chosen within the scope of the present invention.

Several considerations are involved in the ion implantation process of Block 12 above. First, one must choose between implanting the full area of the template in question, as opposed to implanting selected areas. If only selected areas are to be implanted, which may be desirable to facilitate mesa formation in the device fabrication process, for example, then a mask must be defined on the surface of the template prior to implantation. Such mask formation and processing techniques are well understood within the ion implantation industry, and any such approach may be used in the practice of this invention.

Second, one must choose the ion species to be implanted. Virtually any atom in the periodic table can be ionized and implanted into the template; therefore, the choice of a particular ionic species should not be construed to limit the applicability of the present invention. Practically speaking, certain ions are more readily implanted than others from both cost and chemical standpoints. Several commonly implanted ions that one could use in the practice of this invention include He, Ar, Si, and Ga.

Third, the ion implantation dose must be selected. The purpose of the ion implantation step is to induce "knock-on" damage in the template layer without disturbing the surface of the template. The damaged underlying template material will etch more readily and without regard to crystal orientation compared to the non-implanted template material. In contrast to the Smart Cut™ or related ion cutting processes (as described in the co-pending and commonly-assigned U. S. Utility patent application Ser. No. 11/403,624, filed on Apr. 13, 2006, by James S. Speck, Troy J. Baker, and Benjamin A. Haskell, entitled "WAFER SEPARATION TECHNIQUE FOR THE FABRICATION OF FREE-STANDING (Al, In, Ga)N WAFERS," which application claims the benefit under 35 U.S.C. Section 119(e) of U.S. Provisional Patent Application Ser. No. 60/670,810, filed on Apr. 13, 2005, by James S. Speck, Troy J. Baker, and Benjamin A. Haskell, entitled "WAFER SEPARATION TECHNIQUE FOR THE FABRICATION OF FREE-STANDING (Al, In, Ga)N WAFERS," which applications are incorporated by reference herein), the dose must be low enough and the implanted species immobile enough that the ions will not diffuse enough to coalesce into bulk voids in the template crystal when heated to the device growth temperature. Typical ion implant doses for the practice of this invention will be between $10^{14}$ and $10^{16}$ cm$^{-2}$, though the actual dose will depend on the species implanted and may deviate from this range by as much as a factor of 100. The choice of a precise dose does not fundamentally alter the practice of the present invention.

Fourth, it is necessary to select the ion implantation profile. This choice will be dictated primarily by the thickness of the template and the depth of template material to be removed by chemical etching. Ideally, the damage layer should extend from a few tens of nanometers below the template surface through the entire thickness of the template to the template/substrate interface. Practically speaking, ion implantation depths are limited by the energy of the implanted species and depths in excess of roughly 2 μm are difficult to achieve. Nonetheless, this invention should be understood to include any range of ion implantation depths. It is critical, however, that the ion implantation profile be such that the template's surface remain intact following the implantation process so as to provide a high quality crystalline surface for device regrowth.

FIGS. 2(a), (b) and (c) illustrate sample ion implantation profiles according to the preferred embodiment of the present invention. In these figures, "substrate surface" and the associated dashed line indicates the top of the substrate, "template surface" and the associated dashed line indicates the top of the template layer, 0 to Max represents the implantation dose, the distance between the dashed lines represents the ion implantation depths, and the solid lines represent the ion implantation profiles of dose as a function of depth.

The shape of the profile should ideally be a top-hat shape, such as that shown in FIG. 2(a). Such a profile would provide for uniform etching at all depths from the debonded substrate interface to an etch stop point just below the surface of the template layer, with no damage of the template surface.

In practice, sharp ion implant profiles are not readily achieved. A more realistic profile is shown in FIG. 2(b). This profile approximates the top hat profile but has tails at both surfaces due to random diffusion of the implanted species during the implantation process. In such a case, mechanical or dry etching of a small depth from the debonded surface would be required to expose the ion implanted material. Any implanted material containing more than some threshold foreign ion concentration (which would vary based on the implanted species), would be removed by the chemical etching step. The precise etch rate may vary depending on the local ion dose as well.

Such etch rate variation could be utilized using a profile such as that shown in FIG. 2(c). One would expect the etch rate to decrease as the ion concentration decreases from the peak implantation dose. This variation on the invention could be useful in some device applications, though as the dose drops below some critical value the risk of crystallographic etching, exposing inclined facets, increases. It should be understood from this description that many different ion implantation profiles are compatible with the present invention. The examples shown in FIGS. 2(a), 2(b) and (2C) should in no way be construed to limit the profile shapes that may be used in the practice of this invention.

Following ion implantation, the implanted template wafer may optionally be cleaned or otherwise pretreated to enhance epitaxial regrowth. The wafer is then loaded into a suitable growth chamber, such as but not limited to a MOCVD or MBE growth chamber, and a structure is grown on the implanted template. Such structure may range from a bulk (Al, In, Ga)N layer of any thickness to a complex multi-layer structure incorporating varying alloy compositions and dopants. The details of the regrown structure have no impact on the practice of the present invention. Indeed, any material that is chemically compatible with the template layer and the intended etchant solution may be grown in this step.

In Block 16, the regrown structure's free surface is fused or bonded to a handle or carrier wafer via one of a variety of wafer bonding techniques. Many such techniques are practiced throughout the microelectronics industry and virtually all are applicable to the practice of this invention. The choice of carrier wafers does not impact the practice of the invention either. The carrier wafer should be chemically inert in the etchant of choice and mechanically robust enough to survive future processing of the wafer, and should preferably be a low cost material. Many such carrier wafer materials, including but not limited to silicon and polycrystalline aluminum nitride, satisfy these guidelines.

In Block 18, the original growth substrate is removed from the bonded template/carrier wafer structure. As discussed above, the debonding method will be related to the choice of substrate, and may include wet etching, photo- or photochemically-assisted etching, any dry etching technique, laser-assisted debonding, mechanical removal, or any other suitable technique that will not damage the template and regrown structures. One skilled in the art will recognize that many substrate removal techniques are compatible with the present invention. The necessity of the sixth process step listed above, removal of residual non-implanted template material from the backside of the template, depends on the substrate removal technique, ion implantation profile, and template thickness. This process is intended to expose ion implanted template material at the free surface. Any of a variety of wet or dry etching techniques can be used in this process step.

Finally, the exposed backside of the implanted surface is exposed to a solution containing a suitable etching agent, such as potassium hydroxide or hydrochloric acid. While both of these chemicals are known to be effective etching agents of (Al, In, Ga)N for the practice of this invention, many other acids and bases and solutions thereof containing oxidizers or other constituents may be used in the practice of this invention. A wide range of solution concentrations may be used in the practice of the invention. The ideal concentration will vary from one etching agent to another. As an example, concentrations of KOH from 1 to 50% in water are compatible with this invention, though said example should in no way be construed to limit the range of etching solution compositions that may be used in the practice of this invention. The sample may optionally be agitated during the etching process to facilitate mass transport of etch products away from the sample and to renew the solution in the vicinity of the sample surface. The sample may also optionally be biased or illuminated or both to enhance the etching rate by generating electron-hole pairs at the exposed surfaces that facilitate oxidation of the implanted template material.

During the etch process, the implanted template material will be removed at a rate ranging from 1 to 5,000 Å/minute, depending on the ion implantation dose, the (Al, In, Ga)N composition, and the etchant solution characteristics. The etch will occur non-crystallographically, as material will be removed from all implanted surfaces that are exposed to the etchant at comparable rates. Furthermore, non-implanted material and material that has a minimal foreign ion concentration will not be attacked by the etchant. Thus, the ion implantation profile both serves to facilitate removal of template material and defines an etch stop plane within the template layer, making the etching process self-limiting. Also, as the device structures or other material regrown on the template following implantation is of high quality and free of knock-on damage, this subsequently grown material will be untouched by the template etching process. The invention therefore provides a selective etching technique that can be used for removal of excess (Al, In, Ga)N from the backside of a template without harming sensitive device layers. This process would be particularly useful in the fabrication of microcavity light emitting structures, as the invention does not expose the device cavity itself to ion bombardment, mechanical stresses, or irradiation, while still providing for the well-defined removal of underlying material.

EXAMPLE

The following example further describes these process steps and their results.

A template wafer is formed by growing a two μm thick GaN film on a 20 nm thick AlN nucleation layer on a c-plane sapphire substrate by conventional MOCVD. The resulting template wafer is removed from the growth system. The wafer is then implanted with Ga ions uniformly over the entire area of the wafer with a constant ion concentration of $5 \times 10^{16}$ cm$^{-2}$ through a depth of 1.5 μm, stopping at a depth of 50 nm from the free surface. The implanted template is then reloaded into a MOCVD growth system and a microcavity LED structure is grown directly on the implanted template. Following growth, the wafer is cooled to room temperature. The free surface of the wafer is bonded to an AlN carrier wafer and the original sapphire substrate is removed via laser-assisted debonding. Conventional chemi-mechanical polishing is used to remove the AlN nucleation layer and the ~450 nm of exposed non-implanted GaN from the debonded film. The film/carrier wafer is then placed in a 20 vol. % KOH solution, heated to 75° C., and allowed to soak for 30 minutes. During this soak time, the ion implanted GaN is removed non-crystallographically though chemical etching. The resulting structure is a microcavity device structure with 50 nm of remaining template material at the planar free surface, all bonded to a carrier wafer.

References

A substantial body of literature exists pertaining to the use of ion implantation for enhanced etch selectivity. Several of these references are given below. However, none of the prior art suggest any applications pertaining to (Al, In, Ga)N substrates or films as are described herein. The following references are cited as being relevant, and are incorporated by reference herein:

1. U.S. Pat. No. 6,120,597, issued Sep. 19, 2000, to Levy et al., is entitled "Crystal ion-slicing of single-crystal films." This patent covers ion slicing of metal oxides. While the research that led to this patent provided background for the present invention, this patent makes no mention of ion slicing of metal nitrides as is the case in the present invention.

2. M. S. Minsky, et al., Appl. Phys. Lett., 68 (11) 1531 (1996). The first demonstration of photoelectrochemical (PEC) wet etching was performed at UCSB by M. S. Minsky. This paper is provided as a reference on the PEC etching process as background to the present invention.

3. United States Utility Patent Application Publication No. US 2002/0096496, filed Nov. 29, 2000, published Jul. 25, 2002, by Molnar et al., and entitled "Patterning of GaN crystal films with ion beams and subsequent wet etching." Molnar's group at the Naval Research Lab (NRL) discussed etching of ion implanted GaN in this patent application.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, such as additional adjustments to the process described herein, without fundamentally deviating from the essence of the present invention. It is intended that the scope of the invention be limited not by this detailed description, but rather by the claims appended hereto.

What is claimed is:

1. A method of etching thin epitaxially-grown nitride layers, comprising:
   (a) selecting a suitable template or substrate;
   (b) implanting the template or substrate with foreign ions over a desired area to create ion implanted material;
   (c) performing a regrowth of a nitride device structure on the implanted template or substrate;
   (d) bonding an exposed growth surface of the nitride device structure to a carrier wafer, so that the nitride device structure is positioned between the carrier wafer and the implanted template or substrate, to create a bonded nitride device structure/carrier wafer structure; and
   (e) exposing the ion implanted material on the bonded nitride device structure/carrier wafer structure to a suitable etchant for a sufficient time to remove the ion implanted material from a surface of the implanted template or substrate opposite the nitride device structure, so that the surface of the implanted template or substrate is planar on a nanometer scale.

2. The method of claim 1, further comprising removing a portion of the template or substrate from the nitride device structure/carrier wafer structure after the bonding step (d) and before performing the exposing step (e).

3. The method of claim 2, further comprising removing any residual material to expose the ion implanted material after removing the template or substrate and before performing the exposing step (e).

4. The method of claim 1, wherein the desired area is an entire wafer.

5. The method of claim 1, wherein the exposing step (e) comprises performing a chemical etching process in which etching proceeds in a lateral fashion to separate the regrowth from the substrate.

6. The method of claim 1, wherein the exposing step (e) comprises selectively etching the ion implanted material to an etch stop below the template or substrate surface and defined by an implantation profile or damage layer.

7. The method of claim 1, wherein the template or substrate is removed either over at least one selected area or completely to form at least one nitride membrane structure or at least one thick nitride wafer.

8. The method of claim 1, wherein the template or substrate surface remains intact following the implanting step (b) so as to provide a high quality crystalline surface for the regrowth.

9. The method of claim 1, wherein the implanting step (b) comprises selecting a dose and an implanted species of ion such that implanted ions do not diffuse enough to coalesce into bulk voids when heated to a growth temperature.

10. The method of claim 1, wherein the implanting step (b) comprises selecting an implantation profile or damage layer for the implanting step (b).

11. The method of claim 10, wherein the implantation profile determines an etch rate and a risk of crystallographic etching for the ion implanted material.

12. The method of claim 10, wherein the implantation profile or damage layer extends from a few tens of nanometers below the template or substrate surface through a thickness of the template or substrate.

13. The method of claim 1, wherein:
(1) the implanting is below the surface of the template or substrate such that the surface of the template or substrate remains intact following the implantation process, thereby providing a crystalline surface suitable for regrowth on the surface of the template or substrate; and
(2) the nitride structure/carrier wafer structure is etched from a surface different from a growth surface of the nitride device structure regrowth, thereby minimizing damage to the nitride device structure regrowth.

14. The method of claim 13, wherein the nitride structure/carrier wafer structure is etched from a backside opposite the growth surface, thereby minimizing damage to the nitride device structure regrowth.

\* \* \* \* \*